US011075663B2

(12) United States Patent
Pine

(10) Patent No.: US 11,075,663 B2
(45) Date of Patent: Jul. 27, 2021

(54) METHOD AND APPARATUS TO RUGGEDIZE A MOBILE DEVICE FOR PUBLIC SAFETY OR MOBILE USE

(71) Applicant: Jerrold Scott Pine, Boca Raton, FL (US)

(72) Inventor: Jerrold Scott Pine, Boca Raton, FL (US)

(73) Assignee: Man & Machine Inc., Landover, MD (US)

( * ) Notice: Subject to any disclaimer, the term of this patent is extended or adjusted under 35 U.S.C. 154(b) by 0 days.

(21) Appl. No.: 16/884,986

(22) Filed: May 27, 2020

(65) Prior Publication Data

US 2020/0382150 A1 Dec. 3, 2020

Related U.S. Application Data

(60) Provisional application No. 62/853,510, filed on May 28, 2019.

(51) Int. Cl.
| | |
|---|---|
| *H04B 1/3888* | (2015.01) |
| *H04B 1/036* | (2006.01) |
| *A45C 11/00* | (2006.01) |
| *G06F 1/20* | (2006.01) |
| *H04M 1/02* | (2006.01) |
| *H04M 1/18* | (2006.01) |
| *H05K 7/20* | (2006.01) |

(52) U.S. Cl.
CPC ............ *H04B 1/3888* (2013.01); *A45C 11/00* (2013.01); *G06F 1/203* (2013.01); *H04B 1/036* (2013.01); *H04M 1/026* (2013.01); *H04M 1/185* (2013.01); *A45C 2011/002* (2013.01); *H05K 7/20336* (2013.01); *H05K 7/20509* (2013.01)

(58) Field of Classification Search
CPC ....... H04B 1/3888; H04B 1/036; A45C 11/00; A45C 2011/002; G06F 1/203; H04M 1/026; H04M 1/185; H05K 7/20336; H05K 7/20509
See application file for complete search history.

(56) References Cited

U.S. PATENT DOCUMENTS

| | | | | |
|---|---|---|---|---|
| 9,151,679 B2 * | 10/2015 | MacDonald | ........... | G01K 1/024 |
| 9,401,977 B1 * | 7/2016 | Gaw | ......................... | G01V 8/10 |
| 9,930,155 B2 * | 3/2018 | Gaw | ....................... | H04M 1/73 |
| 10,433,194 B2 * | 10/2019 | McFarland | ........... | H04W 24/04 |
| 2008/0096609 A1 * | 4/2008 | Lam | ...................... | H04B 1/036 |
| | | | | 455/566 |

(Continued)

FOREIGN PATENT DOCUMENTS

WO    WO-2014004996 A1 *  1/2014  ............. H04B 1/525

*Primary Examiner* — Lewis G West

(57) ABSTRACT

This present invention pertains to a method and apparatus to take a consumer grade mobile device such as a smartphone or tablet computer with or without a desktop mode and use a protective mobile device case optimized for temperature regulation and heat transfer and couple them to a vehicle or a cart based dock capable of maintaining mobile device operating temperatures when exposed to extreme high or low temperatures seasonally. A temperature control monitors thermally sensitive internal component temperatures within the mobile device and triggers heating or cooling based on preset temperature thresholds designed to protect those components.

19 Claims, 9 Drawing Sheets

(56) References Cited

U.S. PATENT DOCUMENTS

2009/0320516 A1\* 12/2009 Kanagaki .................. A45F 3/04
　　　　　　　　　　　　　　　　　　　　　　　　62/457.2
2017/0245393 A1\* 8/2017 Kim ........................ F28F 13/10

\* cited by examiner

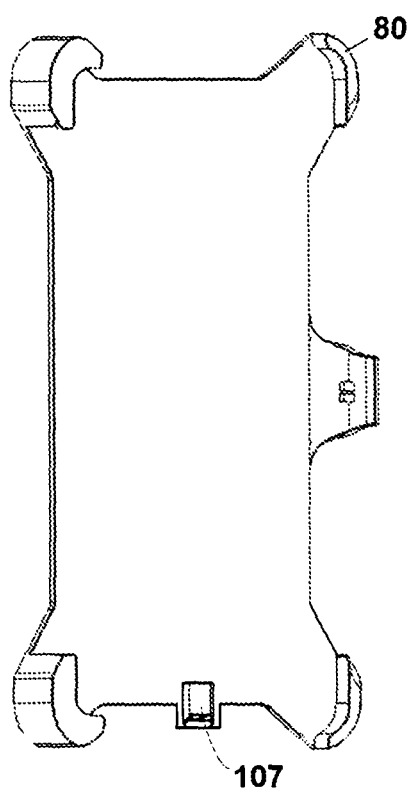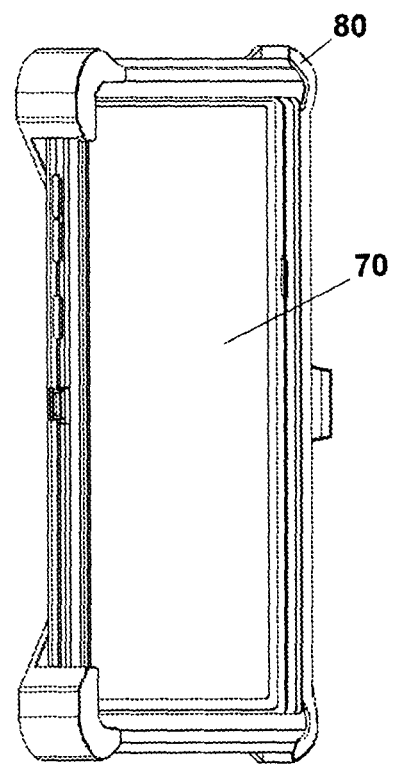
Fig. 8
Fig. 9

METHOD AND APPARATUS TO RUGGEDIZE A MOBILE DEVICE FOR PUBLIC SAFETY OR MOBILE USE

This application claims the benefit of U.S. Provisional Application No. 62/853,510, filed May 28, 2019.

BACKGROUND OF THE INVENTION

Smartphones and tablets continue to evolve with greater processing power and graphics capabilities. Chip sets designed for mobile computing are becoming more power efficient with improvements in system architecture and advanced power management. The amount of power used by a CPU/GPU is a function of voltage, frequency and capacitance. While the system capacitance is generally fixed in the silicon design, the voltage and frequency can vary during runtime and are managed to optimize power consumption. Very high performance mobile processors like the Qualcomm Snapdragon 845 use very sophisticated dynamic clock and voltage scaling to optimize power consumption but can still demand 7 watts of power during peak demand. All of that power is dissipated in the form of heat. Mobile device mechanical designs must use systems and materials capable of dissipating this heat effectively while maintaining an aesthetic, mass and form factor suitable for mobile use. Construction of mobile devices vary significantly however a premium smartphone such as the Samsung Note 9 have the display and back surfaces made from Corning Gorilla Glass 5 and the phone's inner frame/outer-edge made from series 7000 aluminum that transfer heat efficiently.

There are several components within a mobile device that are sensitive or can even be destroyed by excessive heat or cold. The CPU/GPU chipsets and lithium ion batteries are among the components that excessive heat and cold will damage, destroy, or shorten their useful life. Temperature sensors are generally embedded within mobile devices to monitor temperatures of these components. As component temperatures rise or fall, a mobile device can throttle down CPU speeds, turn off power draining applications, or turn off the mobile device to prevent damage. For consumer use, the inconvenience of these interruptions is preferable to damaging or destroying a mobile device. However, thermal protections that impair mobile device functionality can impact that mobile device technology from being adopted for mission critical public safety use.

There are very large strategic and financial incentives to discontinue expensive trunked communication systems for public safety use and migrate to large cellular networks. The federal government has sponsored the creation of "FirstNet" using the ATT cellular infrastructure. Mobile devices are being adopted for FirstNet public safety use. Many manufacturers are creating rugged versions of mobile devices for public safety use. These rugged devices have extended operating temperature ranges and have built in mechanical features to further protect against accidental drop and shock. These rugged products meet mission critical requirements but come with a hefty price tag 2-3 times more expensive then their consumer counterparts. It would be fiscally more appropriate to supplement commercially available off the shelf mobile devices with low cost peripheral devices that enhance them so they meet mission critical requirements. The protective mobile device case for instance can be modified or redesigned to facilitate heat transfer in or out making external temperature compensation possible.

Another facet of mobile device adaptation in public safety is their ability to interface with CAD-Computer Aided Dispatch & RMS-Record Management Systems used in police and fire vehicles. Police and fire vehicles are typically deployed with rugged computing systems which typically include a mounted laptop, or mounted computer, display and keyboard with wireless modem. Prior to mobile device deployment, police would need to get back in their patrol cars during routine stops to interface with their computers to look up critical records information. Now their records management is fully mobile and mitigates the need for redundant computers in their vehicles. One important feature available on some Samsung FirstNet smartphones is called DeX which stands for desktop experience. A DeX enabled mobile device allows one to attach a display and keyboard to use the mobile device in desktop mode with a large display and keyboard for enhanced ergonomic use. The mobile device can interface to a dock in the car with display and keyboard and function as a car based system, and then be removed when on an active call. This configuration can greatly reduce the system cost, and with technology refresh cycles every three to five years, can save municipalities tens of millions of dollars going forward.

It is the intent of this invention to illustrate methods and means to take a consumer grade mobile device and use a protective mobile device case optimized for temperature regulation and to couple them to vehicle docks capable of maintaining mobile device operating temperatures when exposed to extreme high or low temperatures seasonally.

SUMMARY OF THE INVENTION

What is needed is a methodology to facilitate optimization of mobile device thermal dispersion through a mechanically protective case.

What is further needed is to provide optimal thermal conductivity between a mobile device, protective case, and a vehicle dock.

What is further needed is to provide a means to regulate a mobile device's temperature using peltier heating and cooling in a mobile dock.

What is further needed is to provide a means to control heating and cooling in the mobile dock by polling the mobile devices internal temperature sensors.

What is further needed is to provide a pogo pin electrical interface between the mobile device protective case and the vehicle dock to facilitate high number of engagement cycles.

BRIEF DESCRIPTION OF THE DRAWINGS

The present invention will become more fully understood from the detailed description given hereinbelow and the accompanying drawings which are given by way of illustration only, and thus are not limitive of the present invention, and wherein:

FIG. 8 is a perspective view of a cradle/dock that holds the mobile device in a case, while in use, according to the prior art.

FIG. 9 is a perspective view of the mobile device in the case nested in the cradle/dock, while in use, according to the prior art.

DETAILED DESCRIPTION OF THE PREFERRED EMBODIMENTS

Figure 1A:
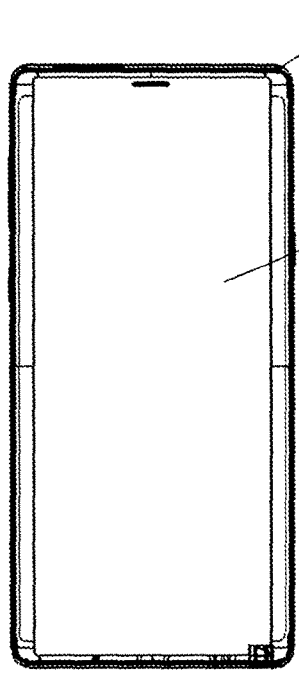
FIG. 1A is a front, 1B is a side, 1C is a rear view of a common mobile device, while in use, according to the prior art.
Figure 1B:
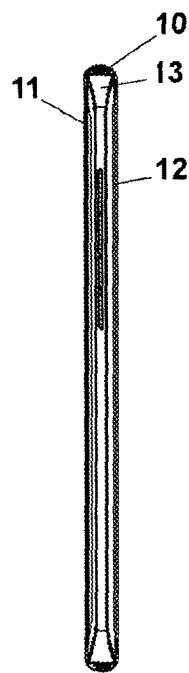
Figure 1C:
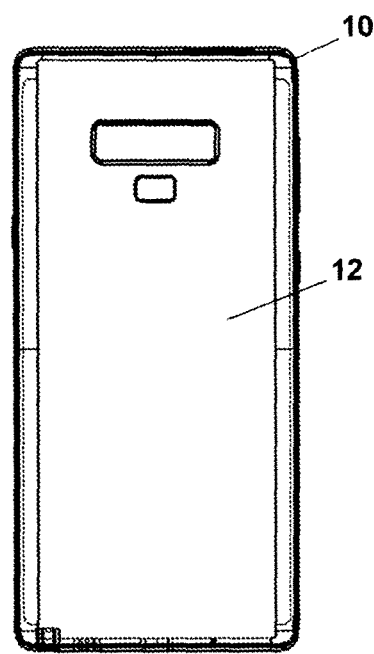

Referring to FIGS. 1A, 1B, and 1C, the front, side, and back of a mobile device 10 is illustrated. A mobile device 10, which can be any type of smartphone, tablet computer, or other mobile computing device, that is illustrated here as the Note 9 Smartphone Manufactured by Samsung headquartered in Seoul, South Korea and is representative of several smartphone or tablet computers capable of an alternate desktop mode they call DeX. Desktop mode is where the CPU/GPU of the mobile device 10 can be integrated wirelessly or over USB type C cable with one or more monitors and a keyboard and touchpad/mouse/touchscreen to function as a desktop computer that overcomes the limitations of the mobile device's small screen and tiny user interface. It can be appreciated that desktop mode is representative of many solutions such as Vysor or Apowermirror that can cast or duplicate a desktop experience from a mobile device 10 whether over USB, Wi-Fi, or Bluetooth.

The mobile device 10 exterior as illustrated here comprises three primary surfaces, a front surface 11 made from Gorilla Glass five, a back surface 12 also made from Gorilla Glass five and the side perimeter of the mobile device 10 made from series 7000 aluminum. Gorilla Glass five is manufactured by Corning Inc. of Corning, N.Y. and is made from chemically strengthened alkali-aluminosilicate and has a Vickers hardness rating of 701. Series 7000 Aluminum is an aluminum alloy made with Aluminum, Zinc, Magnesium and Copper and has a Vickers hardness rating of 199. These materials are very hard and durable to resist mechanical shock, brakeage and aesthetic scratching. An equally important characteristic of these materials is to dissipate the heat generated by the electronics within the mobile device 10 and by cyclic battery charging and discharging. Many components that dissipate heat within the mobile device 10 are coupled internally through heat sinks, heat pipes, and thermally conductive materials to the external surfaces that conduct heat into the air or any surface the mobile device 10 contacts. The amount of heat transferred is defined by the thermal conductivity of the specific material which is defined as the amount of heat per unit time per unit area that can be conducted through a plate of unit thickness of a given material, the faces of the plate differing by one unit of temperature. It is measured in watts per degree Kelvin. The thermal conductivity of series 7000 aluminum is 154 W/(m K). The thermal conductivity of Gorilla Glass five is 1.2 W/(m K). While the thermal conductivity of series 7000 aluminum is 100× greater then the thermal conductivity of Gorilla Glass five it should be noted that the Gorilla glass five heat conduction path is only 0.4 mm thick and the series 7000 aluminum conducts heat all the way from internal heat pipes and the internal battery over centimeters of distance to the exterior surface. The net effect is that heat is transferred in various amounts across the entire external surface of the mobile device 10.

Figure 2:
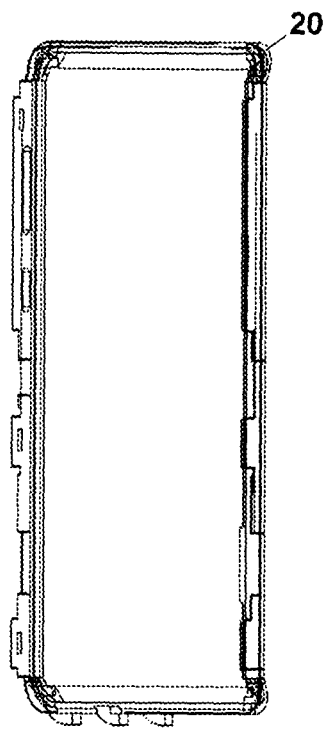
FIG. 2 is a perspective view of the front half of the hard inner case for the mobile device, while in use, according to the prior art.
Figure 3:
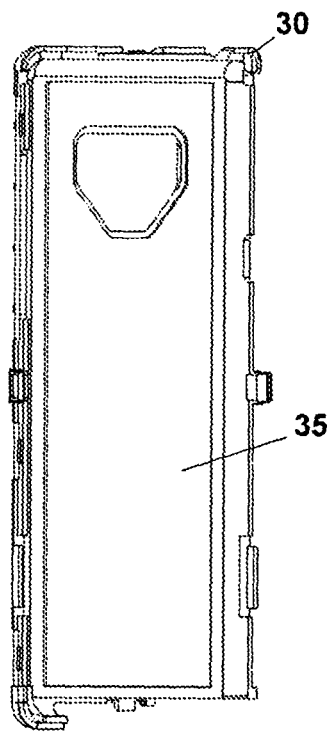
FIG. 3 is a perspective view of the back half of the hard inner case for the mobile device, while in use, according to prior art.
Figure 4:
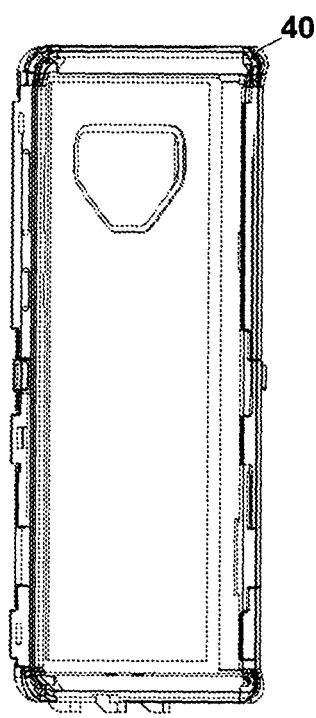
FIG. 4 is a perspective view of the front half of the hard inner case coupled to the back half of the hard inner case for the mobile device, while in use, according to the prior art.

Referring to FIGS. 2, 3, and 4 the front half of hard inner case 20, back half of hard inner case 30 and combined assembly form hard inner case 40. While the construction of the mobile device 10 protects it from many falls up to 1.6 meters on to rough surfaces, many users choose to further protect the mobile device 10 from accidental damage. One such way is to add a phone case of various constructions as illustrated in FIGS. 2-7. The phone case illustrated here is an Otterbox Defender made by Otterbox of Fort Collins, Colo. The front half inner of hard inner case 20 and the back half of hard inner case 30 are made of polycarbonate and snap together sandwiching the mobile device 10.

Attached to the back half of hard inner case 30 situated between the back half of hard inner case 30 and mobile device 10 when assembled is foam liner 35 that is constructed from open celled polypropylene and is approximately 0.040 inches thick. The thermal conductivity of polycarbonate is 0.19 W/(m K) and the thermal conductivity of open cell polypropylene is 0.20 W/(m K). Both of these materials are approximately 10% thermally conductive as Gorilla Glass five and therefore act as thermal insulators relative to the mobile device 10.

Figure 5:
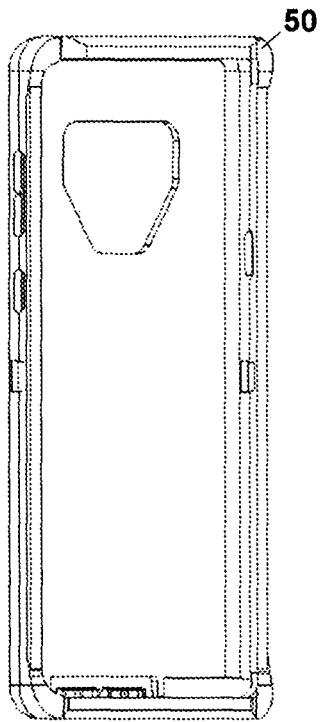
FIG. 5 is a perspective view of the soft outer case for the mobile device, while it is in use, according to the prior art.

Referring to FIG. 5, which is the soft outer case 50. The stated intention of the soft outer case 50 from manufacturers such as Otterbox is to provide environmental protection from liquid and dust intrusion and additional shock protection. Soft outer case 50 can be made from a TPE (Thermo-Plastic Elastomer), Silicone, or Polyurethane material and appears to be proprietary among manufacturers. The thermal conductivity of these materials varies significantly so a direct conclusion as to whether the thermal conductivity of the soft outer case 50 further insulates the mobile device 10 from heat transfer is difficult to discern from publicly available IP.

Figure 6:
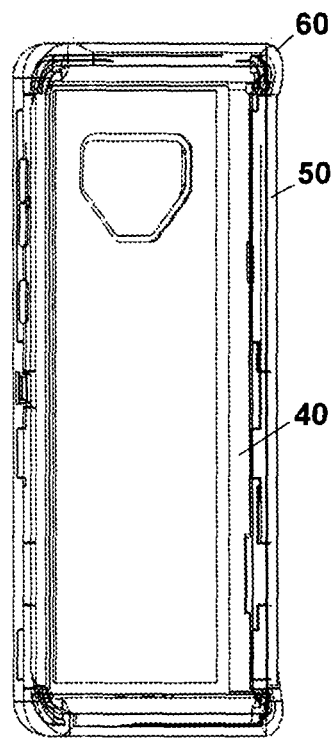
FIG. 6 is a perspective view of the soft outer case coupled to the hard inner case for the mobile device, while in use, according to the prior art.

Referring to FIG. 6, the combined assembly of the front half of hard inner case 20, back half of hard inner case 30 and the soft outer case 50 illustrates the protective mobile device case 60. The multiple layers and materials form a system that has a different net thermal conductivity at each point along the outer surface due to the varying geometries and material thicknesses within the assembly.

Figure 7:
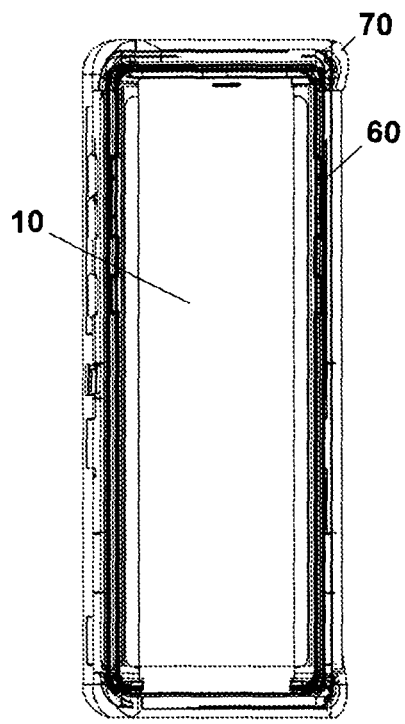
FIG. 7 is a perspective view of the mobile device surrounded by the soft outer case coupled to the hard inner case, while it is in use, according to prior art.

Referring to FIG. 7, the combined assembly of the front half of hard inner case 20, back half of hard inner case 30, the soft outer case 50, and mobile device 10 form a protected mobile device 70 where mobile device 10 is within the protective mobile device case 60. The mobile device 10 geometry and design elements tend to be unique with each subsequent generation of mobile device 10 so the net geometry of the protective mobile device case 60 will vary also. As such the thermal effect of the protective mobile device case 60 on critical elements such as a battery and a CPU/GPU within mobile device 10 can vary between mobile device 10 models and generations. One way to gauge the effect of having a protective mobile device case 60 attached to mobile device 10 is to fix environmental conditions such as temperature and humidity and stress test (Antutu) the CPU/GPU 142 in the mobile device 10 by running software that cycles the mobile device 10 to maximum CPU/GPU 142 usage and monitoring the CPU/GPU 142 temperature and battery 141 temperature during those cycles. By comparing the maximum CPU/GPU 142 and the battery 141 temperatures while the mobile device 10 has no protective mobile device case 60 to the maximum CPU/GPU 142 and battery 141 temperatures when the mobile device 10 is encased in the protective mobile device case 60 you can establish for that particular protective mobile device case 60 and mobile device 10 the net thermal effects. The Peak temperatures in mobile device 10 at an ambient room temperature of 76° F. without protective mobile device case 60 are 88° F. for the battery 141 and 126° F. for the CPU/GPU 142. The Peak temperatures in mobile device 10 at an ambient room temperature of 76° F. with protective mobile device case 60 are 93° F. for the battery 141 and 129° F. for the CPU/GPU 142. The protective mobile device case 60 is a net thermal insulator causing a 5-degree rise in battery temperature and 3-degree rise in CPU temperature during these same test conditions. The thermal insulation is not really a problem at ambient temperatures around 76° F. but in vehicles where temperatures in the vehicle can reach 120° F. the thermal insulation facilitates driving the mobile device 10 into thermal shutdown mode much quicker with higher net operating temperatures.

Referring to FIGS. 8 and 9, the mobile device cradle/dock 80 and protected mobile device 70 in the mobile device cradle/dock 80 are illustrated. The Protected mobile device 70 can slide into, rotate into, or be clipped into the mobile device cradle/dock 80 where the attaching action is featured in well known smartphone cradles or docks such as the commercially available, Strike Alpha Cradle, OtterBox Defender, or Ram Mount GDS dock. The mobile device cradle/dock 80 can be attached to a belt clip, desktop stand, or vehicle mount to hold, use or store a protected mobile device 70. The mobile device cradle/dock 80 is typically fabricated from polycarbonate and acts as a further thermal insulator for heat transfer. The mobile device cradle/dock 80 may be a cradle only or may be a dock which has an electrical interface to external circuitry such as an integrated USB C connector 107 which mates with a USB C mobile device connector 143 at the base of the mobile device 10.

Figure 10:
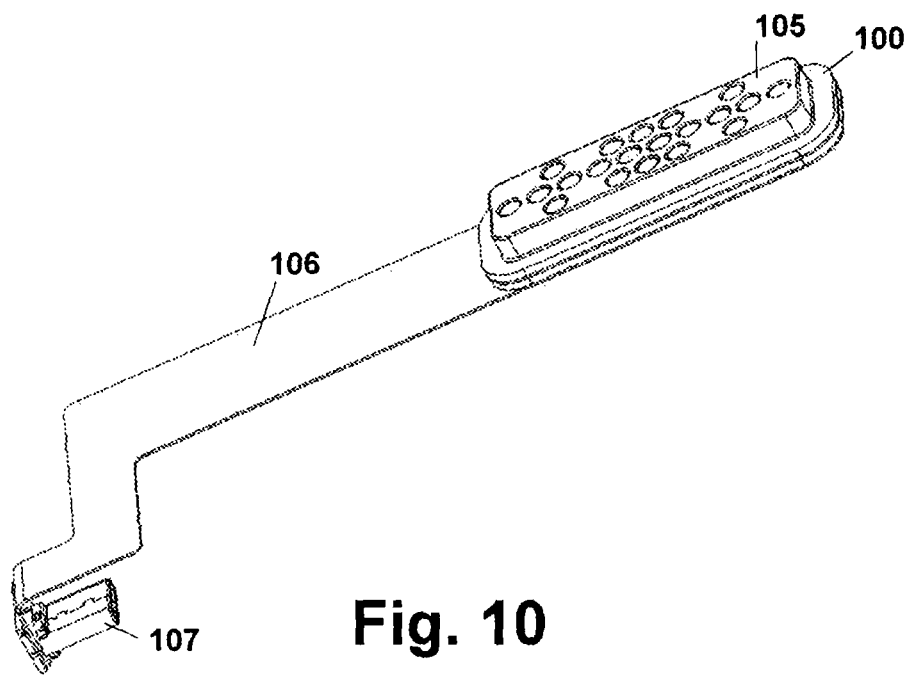
FIG. 10 is a perspective view of the USB type C connector attached to a flex circuit connected to the female half of a pogo pin connector, while in use, according to the present invention.
Figure 11:
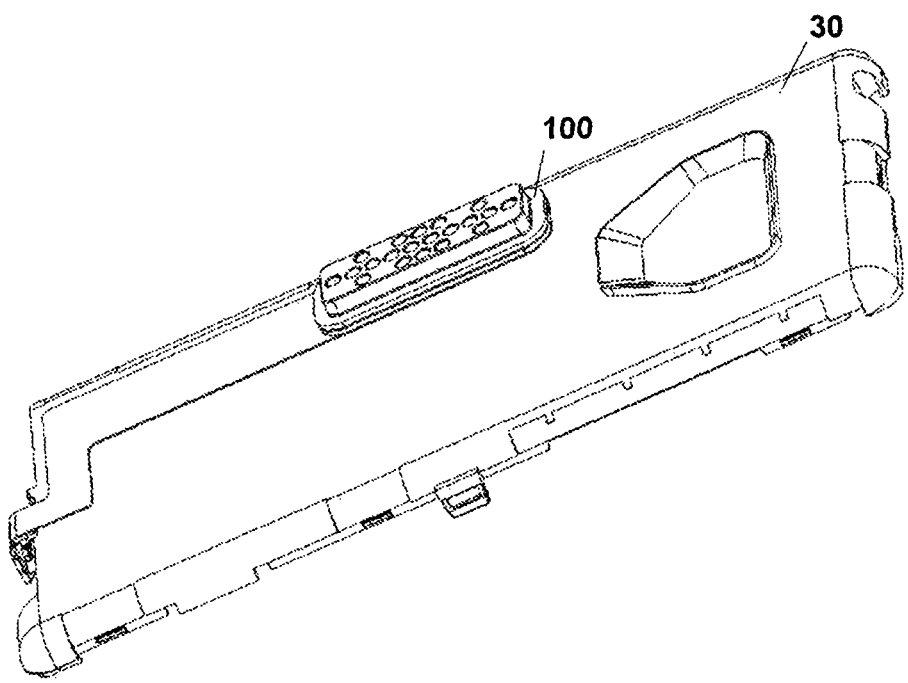
FIG. 11 is a perspective view of the back half of the hard inner case attached to the USB type C connector, flex circuit, and female half of the pogo pin connector, while in use, according to the present invention.
Figure 12:
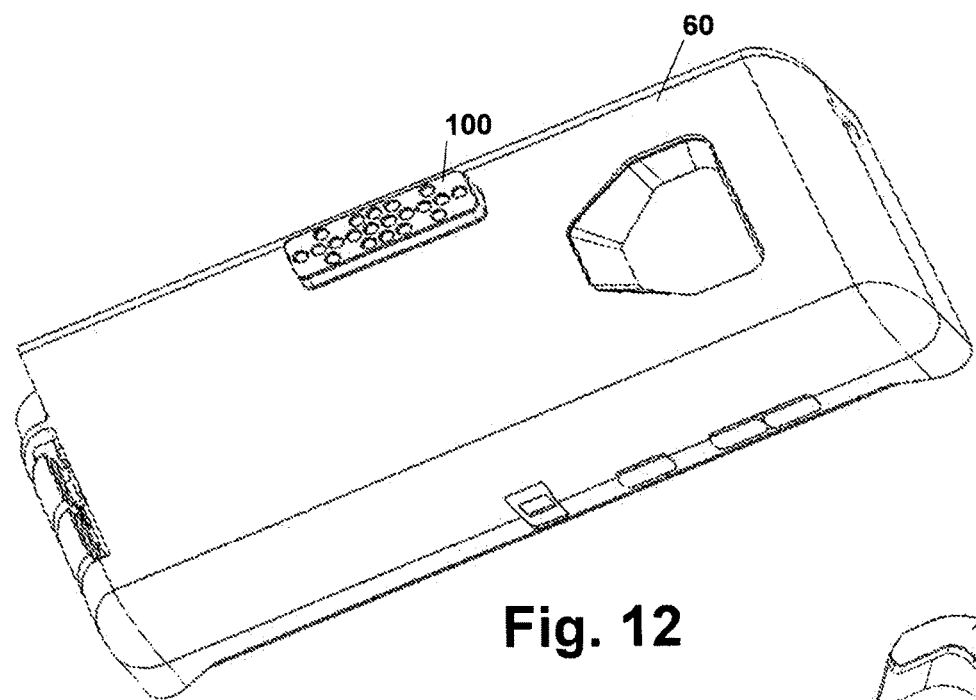
FIG. 12 is a perspective view of the soft outer case, attached to the back half of the hard inner case, USB type C connector, flex circuit, and female half of the pogo pin connector, while it is in use, according to the present invention.

Referring to FIG. 10, a pogo pin interface assembly 100 is illustrated. The pogo pin interface assembly 100 can be made with various constructions known in the art, however as illustrated here it is comprised of a USB C connector 107 routed to a female pogo pin block 105 via a flexible circuit board 106. FIG. 11 shows the pogo pin interface assembly 100 attached on to the back half of hard inner case 30, and in FIG. 12 it shows the pogo pin interface assembly 100 is shown protruding through the surface when the protective mobile device case 60 is assembled. When mobile device 10 is inserted into protective mobile device case 60 having pogo pin interface assembly 100, the USB C connector 107 mates with a USB C phone connector 143 at the base of the mobile device 10. Pogo pin interface assembly 100 is then connected to mobile device 10 and makes it dockable.

Figure 13:
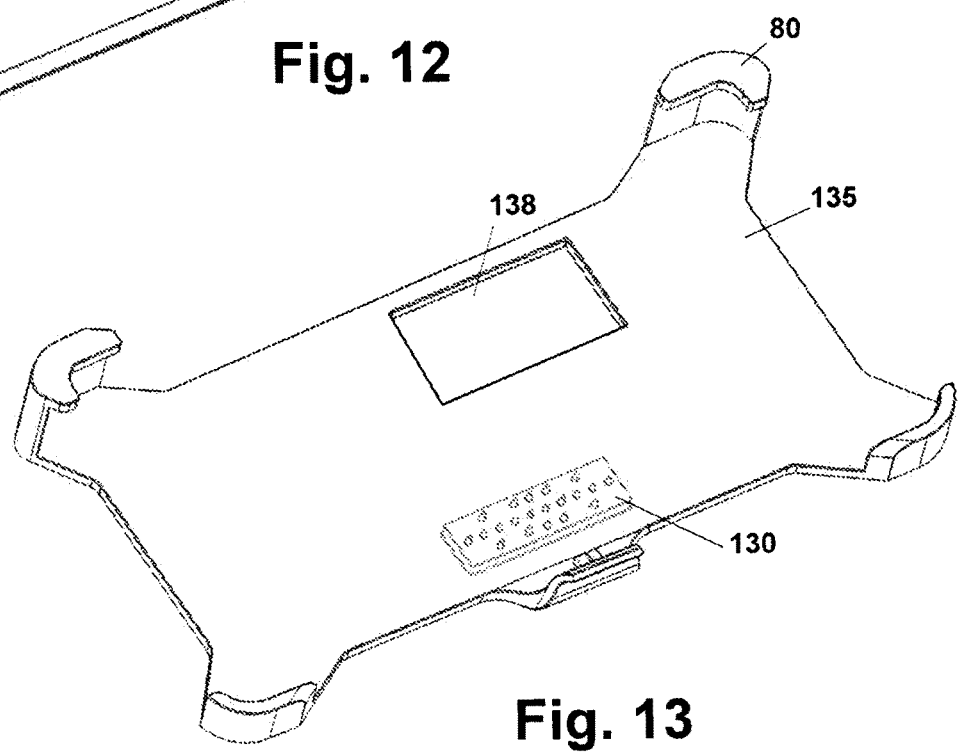
FIG. 13 is a perspective view of the cradle/dock with the male half of the pogo pin connector that mates with the female half of the pogo pin connector in FIG. 12, while in use, according to the present invention.

In FIG. 13 the mobile device cradle/dock 80 is integrated with a female pogo pin interface assembly 130 that can be hard wired to a USB hub or any other USB interface or cable known in the art. The mobile device cradle/dock 80 contains an opening 138 that can be used for access to cool the mobile device 10 in subsequent embodiments. This effectively converts the cradle/dock 80 into docking assembly 135. The protective mobile device case 60 illustrated in FIG. 12 when locked into docking assembly 135 connects a mobile device 10 within the docking assembly 135 to whatever USB device is connected to female pogo pin interface assembly 130. The point of using docking assembly 135 over connecting via a cable to the USB C mobile device connector 143 serves two purposes. The first are pogo pins are rated for a longer service life in terms of number of connections and disconnections, and the second is pogo pins with a large pitch pins are easier to align which makes them easier for blind connections.

Figure 14:
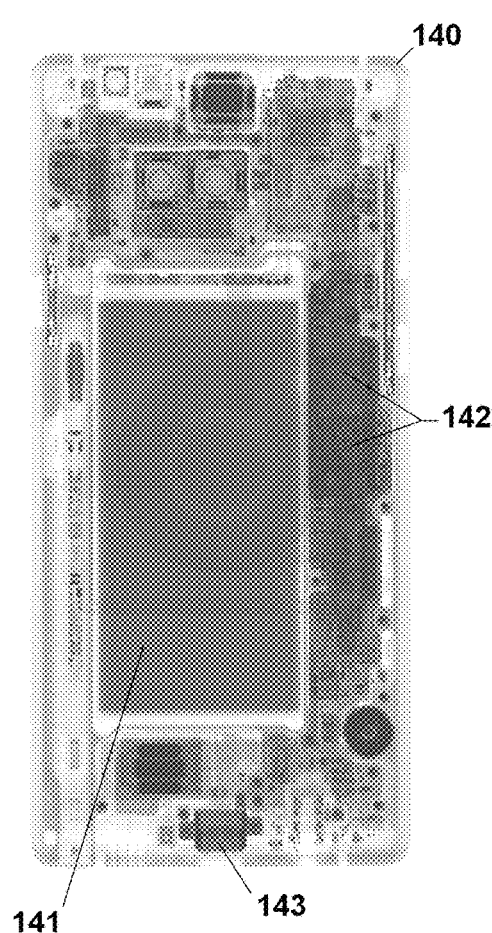
FIG. 14 is an x-ray image of a mobile device, while it is in use, according to the present invention.
Figure 15:
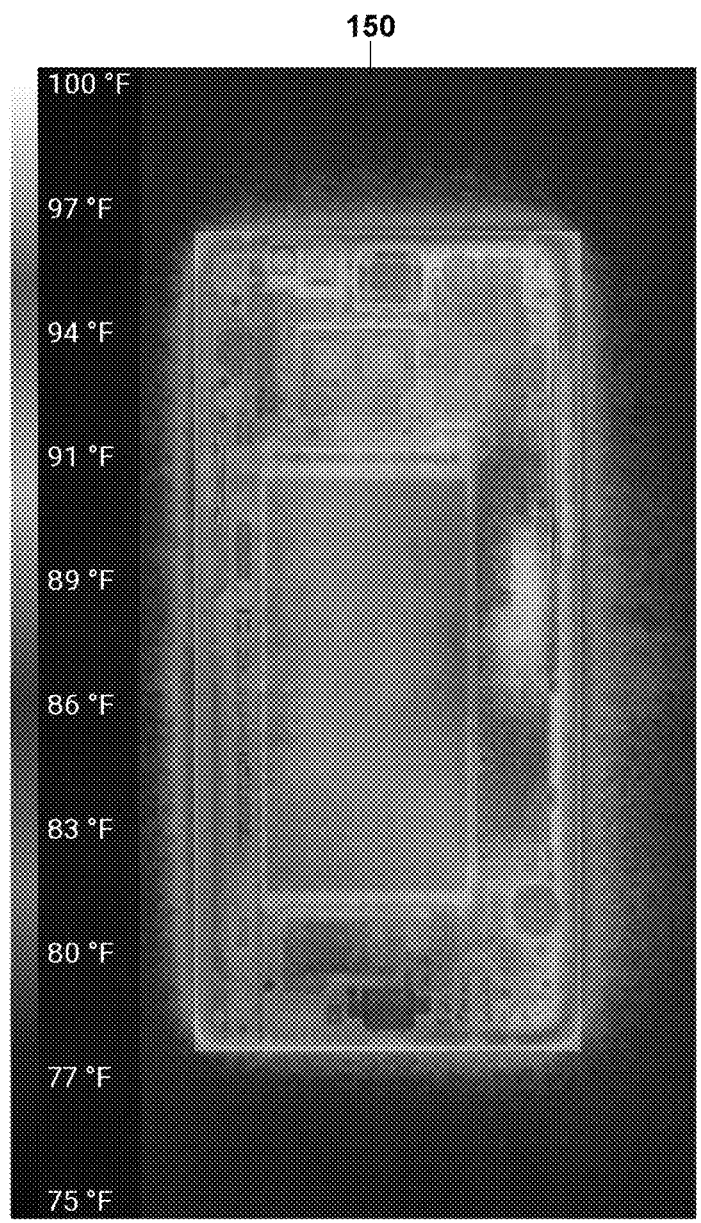
FIG. 15 is a thermal image of a mobile device being stress tested, while in use, according to the present invention.
Figure 16:
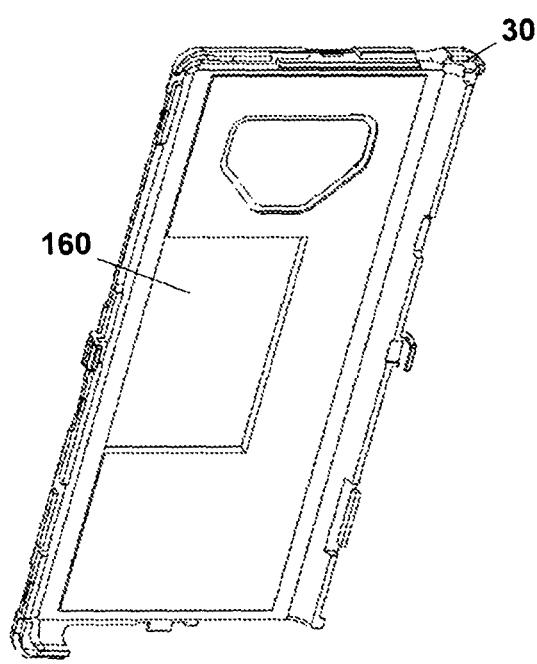
FIG. 16 is a perspective view of the back half of the hard inner case with clearance hole for thermal interface material, while in use, according to the present invention.
Figure 17:
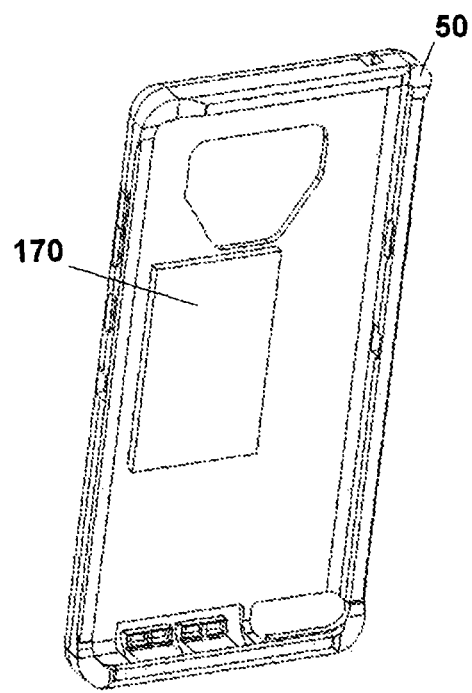
FIG. 17 is a perspective view of the soft outer case with a double shot protrusion of thermal interface material, while in use, according to the present invention.

Referring to FIG. 14, the x-ray image 140 shows component locations within the mobile device 10. Of key importance are the battery 141, the CPU/GPU 142 and the USB C mobile device connector 143. The battery 141 and the CPU/GPU 142 produce heat which must be dissipated and the x-ray image 140 shows their locations relative to heat conducting surfaces in the mobile device 10. In FIG. 15, there is a thermal image 150 of the mobile device 10 during a CPU/GPU 142 stress test with the x-ray image 140 superimposed on to the thermal image 150. It becomes apparent that the surface of the mobile device 10 adjacent to the CPU/GPU 142 is where most of the heat is dissipated. Likewise while the battery 141 charges and discharges rapidly, the surface directly above the battery 141 dissipates the most heat. In establishing a method to optimize cooling or heating a mobile device 10, the initial step will be thermal imaging of the mobile device 10 during high heat producing cycles. The thermal image 150 establishes the locations and geometry where application of active heating/cooling will benefit the most. The energy cost in terms of wattage goes up linearly with area when one uses technology like peltier to heat or cool the mobile device 10. To optimize the heating/cooling energy usage, the active footprint of the peltier is applied to the smallest effective area that will protect the critical components that generate the most heat. The peltier device is a semiconductor based component that requires a thermal coupling material between it and the device being cooled to maximize heat transfer. In the current art, a protected mobile device 70 is encased with thermal insulators that limit the flow of heat away from the critical areas identified from the thermal images 150 above. In FIGS. 16 and 17 a cutout 160 in the back half of hard inner case 30 and a cutout 170 in the soft outer case 50 are illustrated. The Cutout 160 and the cutout 170 remove the insulating materials from the protective mobile device case 60. The cutout 160 and cutout 170 are a size, shape, and location to effectively transfer heat to/from the CPU/GPU 142 and the battery 141.

Figure 18:
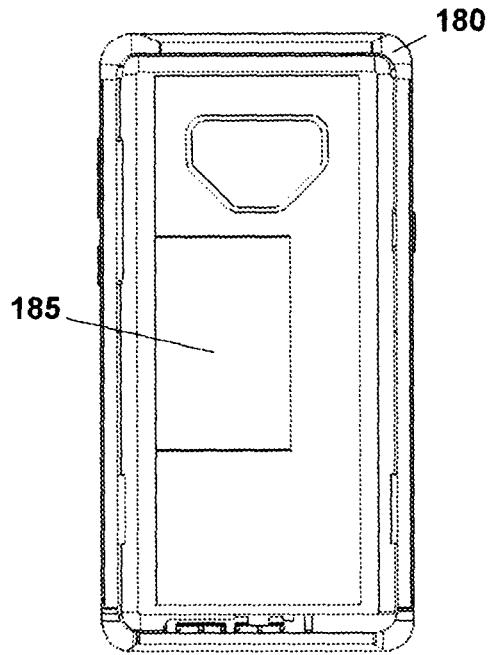
FIG. 18 is a perspective view of the soft outer case with a double shot protrusion of thermal interface material coupled to the back half of the hard inner case with protrusion of thermal interface material flush with inner surface, while in use, according to the present invention.

In FIG. 18, a thermal interface material 185 is inserted into cutout 160 and cutout 170 of protected mobile device 70 and with the addition of thermal interface material 185 becomes thermally a protected mobile device 180. The thermal interface material 185 can be permanently attached to either the back half of hard inner case 30 or the soft outer case 50 using an adhesive or any other means known in the art. The thermal interface material 185 for example could be GS7014 made by General Silicone of Taiwan. The GS7014 material can be formed to any thickness and size and for this example would be the combined thickness of the back half of hard inner case 30 and a the soft outer case 50 plus perhaps 10 mils to form an interference fit with the mobile device 10 and the mobile device cradle/dock 80 when nested. The GS7014 material has a thermal conductivity of 1.4 W/(m K) and is 7× more conductive then the polycarbonate back half of hard inner case 30 and is a little more thermally conductive then gorilla glass five making heat transfer away to/from the back of mobile device 10 very efficient.

Figures 19, 20:
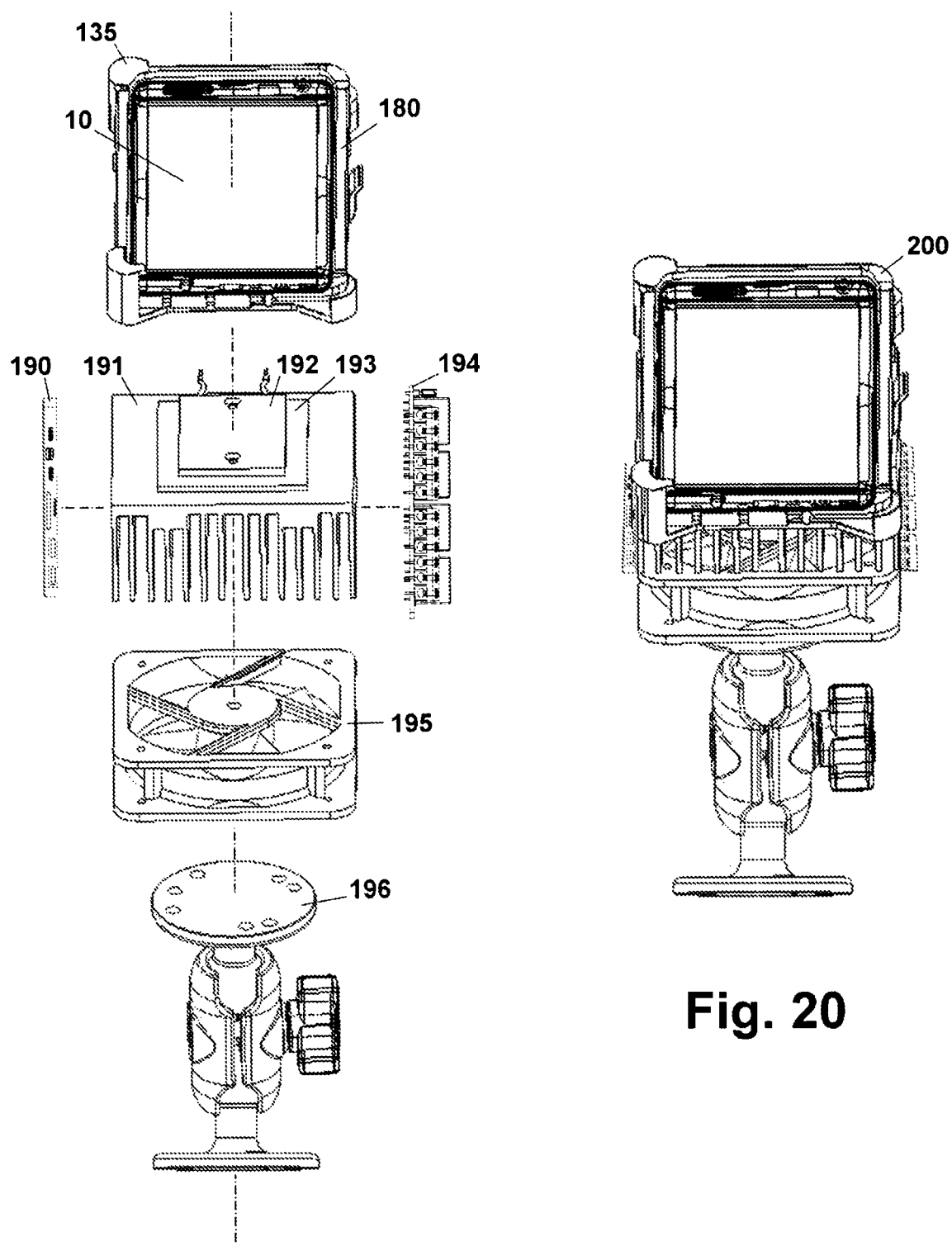
FIG. 19 is an exploded diagram of a mount, cooling fan, heat sink, peltier device, cradle/dock, case and mobile device, while in use, according to the present invention.
FIG. 20 is a perspective view of an assembly comprising a mount, cooling fan, heat sink, peltier device, cradle/dock, case and mobile device, while in use, according to the present invention.

Referring to FIG. 19 and FIG. 20 is an expanded and standard view of an active heating or cooling mobile device dock assembly 200 for mobile device 10. Docking assembly 135 is mated with thermally protected mobile device 180. The bottom surface of the docking assembly 135 is fastened to a heat sink 191 that has fastened to it a heating/cooling peltier device 193 sandwiched between a heating/cooling plate 192 that can be typically metallic and a heat sink 191. There can be a thermally conductive paste or other material known in the art between the heating/cooling plate 192, the heating/cooling peltier device 193, and the heat sink 191 to facilitate thermal coupling. An opening 138 in docking assembly 135 allows heating/cooling plate 192 to be in intimate contact with thermal interface material 185 of the thermally protected mobile device 180. A cooling fan 195 blows air on to the fins of heat sink 191 to facilitate heat transfer to the ambient environment. A mount 196, such as a RAM-B-101U universal double ball mount with two round plates from National Products Inc. of Seattle, Wash., is attached to docking assembly 135 via a round top plate and a vehicle or cart via a round bottom plate. Any mount 196 known in the art can be used as is appropriate for the application. The mobile device 10 is coupled via docking assembly 135 to external circuitry comprising an integral HDMI display port with USB hub 190. The integral HDMI display port with USB hub 190 that is well known in the art can have any configuration of display ports, USB ports, Ethernet ports, audio ports, or any other I/O and is generally capable of charging an attached mobile device 10. The intent of the desktop mode utility is to use mobile device 10 as a desktop style computing system with full size display and keyboard with mouse, touchpad, or touchscreen for input. The display, keyboard, mouse, touchpad, touchscreen and other peripherals are interfaced to the mobile device 10 via the integral HDMI display port with USB hub 190 generally powered up by an external power source such as a vehicle battery. The vehicle battery can be protected by circuitry well known in the art where the vehicle battery is monitored for a low voltage threshold such as 11V and cuts off power to all mobile device 10 related external circuitry before the battery voltage breaches that threshold thereby preventing having a dead battery in the vehicle. Ideally all external circuitry only draws power and operates when any mobile device 10 is docked to conserve the vehicle battery power. The fan/peltier controller 194 is also interfaced to the mobile device 10 via the integral HDMI display port with USB hub 190. The fan/peltier controller 194 is simply a digital I/O board with sufficient channels to enable/disable the cooling fan 195, set the polarity of the heating/cooling peltier device 193 to configure cooling or heating mode, then enable/disable the heating/cooling peltier device 193. Peltier controllers generally use temperature feedback from at least one thermocouple attached externally to the device being cooled or heated to cycle heating and cooling modes based on preset temperatures in the controller. The mobile device 10 has thermal sensors internally that can monitor the CPU/GPU 142, battery 141 and other temperatures. Software within the mobile device 10 can monitor those internal temperatures, compare them to set thresholds for when the mobile device 10 components are too hot or too cold, and communicate to the fan/peltier controller 194 to trigger the appropriate switching I/O to cycle the heating/cooling peltier device 193. Once the internal temperatures of the mobile device 10 components are back to a safe operating temperature, the software can communicate to the fan/peltier controller 194 to trigger the appropriate I/O to disable and reset the heating/cooling peltier device 193. By using temperatures of the components most sensitive to heat damage instead of external device temperatures the components of mobile device 10 are less likely to degrade and fail from temperature extremes. Ideally software on mobile device 10 actively runs exclusively and is triggered to run when the mobile device 10 is docked to conserve the mobile device 10 computing resources. When the mobile device 10 is inoperable because it is out of its nominal operating temperature range, manual switches on the active heating or cooling mobile device dock assembly 200 will be needed to turn on the peltier heating or cooling to return it to a nominal operating temperature range.

It will thus be seen that the needs set forth above, and those made apparent from the preceding descriptions, are effectively attained and since certain changes may be made in the above construction without departing from the spirit and scope of the invention, it is intended that all matter contained in the above description or shown in the accompanying drawings, shall be interpreted as illustrative and not in a limiting sense.

It is also to be understood that the following claims are intended to cover all generic and specific features of the invention herein described and all statements of scope of the invention, which as a matter of language, might be said to fall there between.

What is claimed is:

1. An active heating and cooling dock for a mobile device comprising:
   a heating and cooling sub-assembly comprising a heating and cooling plate coupled to a peltier device for generating active heating and cooling that is coupled to a heat sink having fins, said heat sink transferring heat to and from said peltier device into an ambient environment;
   said heating and cooling sub-assembly is coupled to a docking assembly that detachably couples to the mobile device and provides an electrical interface between the mobile device and an external circuit;

said peltier device responsive to switching I/O controlled by the mobile device coupled to said external circuit that enables said peltier device and controls a direction of heat flow; and a mounting system for said docking assembly.

2. The active heating and cooling dock according to claim 1, wherein said heating and cooling sub-assembly has a cooling fan coupled to said heat sink for generating airflow across said fins of said heat sink to facilitate heat transfer to ambient environment.

3. The active heating and cooling dock assembly according to claim 1 wherein said external circuit comprises a charging circuit for recharging a battery within the mobile device.

4. The active heating and cooling dock assembly according to claim 1, wherein said external circuit further comprises a display port with a USB hub to facilitate operation with one or more peripheral devices.

5. The active heating and cooling dock assembly according to claim 4, wherein said one or more peripheral devices including at least one of a keyboard, a display monitor and at least one of a mouse, a touchpad or a touch screen to facilitate desktop mode for the mobile device.

6. The active heating and cooling dock assembly according to claim 1, wherein said external circuit is powered by a vehicle battery, and wherein said vehicle battery voltage is monitored and further wherein power supplied to said external circuit is interrupted when said battery voltage is equal to or less than a predetermined voltage.

7. The active heating and cooling dock assembly according to claim 1, wherein said switching I/O is controlled by software running on the mobile device in response to internal temperature(s) of at least one element of a group of elements including a CPU, a GPU, a battery or other heat generating element within the mobile device.

8. The active heating and cooling dock assembly according to claim 7, wherein said software on said mobile device actively runs exclusively and is triggered to run when said mobile device is docked to conserve computer resources of said mobile device.

9. The active heating and cooling dock assembly according to claim 1, wherein the mobile device is housed within a protective case having a thermal interface material to enhance thermal conductivity and to effect the transfer of heat to and from at least one element of said group of elements including said CPU, said GPU, said battery or said other heat generating element within the mobile device to said heating and cooling dock.

10. The active heating and cooling dock assembly according to claim 9, wherein said thermal interface material of said protective case is aligned and under compression with said heating and cooling plate of the heating and cooling dock when the mobile device is docked.

11. The active heating and cooling dock assembly according to claim 1, wherein said mobile device couples to a USB connection in said heating and cooling dock to facilitate electrical connection to said external circuit.

12. The active heating and cooling dock assembly according to claim 1, wherein said mobile device couples wirelessly to facilitate electrical connection to said external circuit.

13. The active heating and cooling dock assembly according to claim 1, wherein said mobile device couples to pogo pins within said heating and cooling dock to facilitate electrical connection to said external circuitry.

14. The active heating and cooling dock assembly according to claim 1, wherein said mobile device can slide, clip or rotate to attachably lock into said heating and cooling dock.

15. The active heating and cooling dock assembly according to claim 1, wherein said external circuit only draws power and operates when said mobile device is docked to conserve the vehicle battery power.

16. The active heating and cooling dock assembly according to claim 1, wherein said switching I/O to control said heating and cooling peltier device has at least one manual override switch in the event said mobile device is hotter or cooler than a predetermined temperature to operate said control switching I/O.

17. The method of controlling thermal transfer to and from a mobile device, comprising:

software residing and running on the mobile device that when docked into an active heating and cooling dock begins polling the internal temperature from sensors that measure the temperature of thermally sensitive components within the mobile device;

comparing polled temperatures with thresholds that establish a predetermined temperature range for said components;

upon exceeding said threshold above said predetermined temperature range, said software communicates to said active heating and cooling dock to initiate active thermal cooling of the mobile device;

upon exceeding said threshold below said predetermined temperature range, said software communicates to said active heating and cooling dock to initiate active thermal heating of the mobile device;

continuously polling said temperatures of said thermally sensitive components until all components return to their predetermined operating temperature range and upon such condition said software communicates to said active heating and cooling dock to turn off any active heating or cooling.

18. The method according to claim 17, wherein said thermally sensitive component include at least one of a CPU, a GPU, and a battery.

19. The method according to claim 17, wherein said temperature thresholds for turning off active heating and cooling include hysteresis to prevent rapid cycling on and off of said active heating and cooling.

* * * * *

UNITED STATES PATENT AND TRADEMARK OFFICE
CERTIFICATE OF CORRECTION

PATENT NO. : 11,075,663 B2
APPLICATION NO. : 16/884986
DATED : July 27, 2021
INVENTOR(S) : Jerrold Scott Pine It is certified that error appears in the above-identified patent and that said Letters Patent is hereby corrected as shown below:

In the Claims

Column 9, Lines 32-37, should read:
7. The active heating and cooling dock assembly according to claim 1, wherein said switching I/O is controlled by software running on the mobile device in response to internal temperature(s) of at least one element of a group of elements including a CPU, a GPU, a battery or other heat generating element within the mobile device to maintain said group of elements within a predetermined temperature range.

Signed and Sealed this
Tenth Day of October, 2023

Katherine Kelly Vidal
*Director of the United States Patent and Trademark Office*